(12) United States Patent
Ueno

(10) Patent No.: US 10,770,522 B2
(45) Date of Patent: Sep. 8, 2020

(54) EL DEVICE, MANUFACTURING METHOD FOR EL DEVICE, AND MANUFACTURING APPARATUS FOR EL DEVICE

(71) Applicant: Sharp Kabushiki Kaisha, Sakai, Osaka (JP)

(72) Inventor: Tetsuya Ueno, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 16/466,686

(22) PCT Filed: Jul. 10, 2017

(86) PCT No.: PCT/JP2017/025151
§ 371 (c)(1),
(2) Date: Jun. 5, 2019

(87) PCT Pub. No.: WO2019/012583
PCT Pub. Date: Jan. 17, 2019

(65) Prior Publication Data
US 2019/0363141 A1    Nov. 28, 2019

(51) Int. Cl.
*H01L 27/32* (2006.01)
*H01L 51/56* (2006.01)
*H04N 5/225* (2006.01)

(52) U.S. Cl.
CPC ...... *H01L 27/3234* (2013.01); *H01L 27/3276* (2013.01); *H01L 51/56* (2013.01); *H04N 5/2257* (2013.01); *H01L 2227/323* (2013.01)

(58) Field of Classification Search
None
See application file for complete search history.

(56) References Cited

U.S. PATENT DOCUMENTS

| 9,843,736 | B2* | 12/2017 | Evans, V | H04N 5/2252 |
| 2002/0079512 | A1* | 6/2002 | Yamazaki | H04N 1/024 257/200 |
| 2004/0263670 | A1 | 12/2004 | Yamasaki | |
| 2011/0102308 | A1* | 5/2011 | Nakamura | H01L 27/3234 345/84 |
| 2014/0084405 | A1 | 3/2014 | Tsuchiya et al. | |
| 2014/0340363 | A1 | 11/2014 | Ikeda et al. | |
| 2016/0021314 | A1 | 1/2016 | Kurokawa et al. | |
| 2017/0139253 | A1 | 5/2017 | Hirakata et al. | |

(Continued)

FOREIGN PATENT DOCUMENTS

JP    2010-230797 A    10/2010
JP    2011-120200 A    6/2011

(Continued)

OTHER PUBLICATIONS

Official Communication issued in International Patent Application No. PCT/JP2017/025151, dated Oct. 3, 2017.

*Primary Examiner* — Ali Naraghi
(74) *Attorney, Agent, or Firm* — Keating & Bennett, LLP

(57) ABSTRACT

An EL device includes a display panel and an imaging element, and the display panel includes a panel substrate and an EL layer, and an imaging hole for guiding light from a subject to the imaging element is formed in the display area to straddle a plurality of scanning signal lines and a plurality of data signal lines when viewed from a direction perpendicular to a display area.

7 Claims, 5 Drawing Sheets

(56) References Cited

U.S. PATENT DOCUMENTS

| | | | |
|---|---|---|---|
| 2018/0053032 A1* | 2/2018 | Ding | G06K 9/0004 |
| 2020/0026899 A1* | 1/2020 | Sun | G06K 9/0004 |
| 2020/0052048 A1* | 2/2020 | Kuo | G06F 1/1605 |

FOREIGN PATENT DOCUMENTS

| | | |
|---|---|---|
| JP | 4886162 B2 | 2/2012 |
| JP | 2014-067577 A | 4/2014 |
| JP | 2015-005280 A | 1/2015 |
| JP | 2016-029794 A | 3/2016 |
| JP | 2017-097342 A | 6/2017 |
| WO | 2012/164259 A1 | 12/2012 |

* cited by examiner

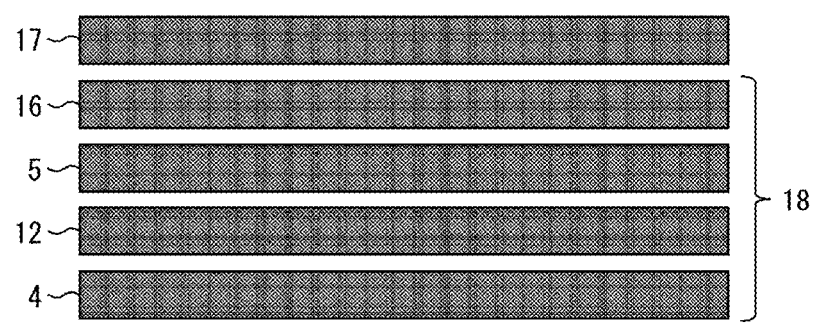
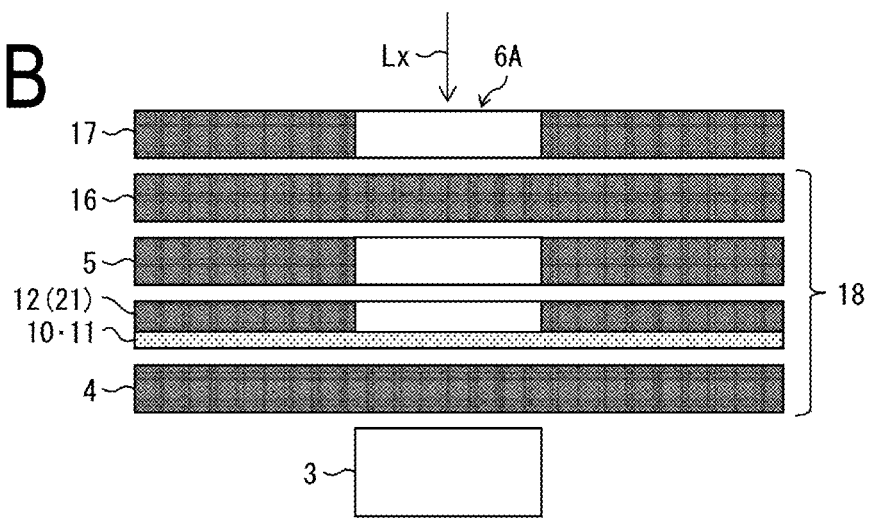

EL DEVICE, MANUFACTURING METHOD FOR EL DEVICE, AND MANUFACTURING APPARATUS FOR EL DEVICE

TECHNICAL FIELD

The disclosure relates to an electroluminescence (Electro Luminescence: EL) device, a manufacturing method for the EL device, and a manufacturing apparatus for the EL device in which an image hole for guiding light from a subject to an imaging element is formed in a display panel.

BACKGROUND ART

A configuration has been known that allows an imaging hole having a large opening diameter corresponding to an imaging element to be formed in an effective region on a display surface of a display panel to mount a camera on the full-screen display panel (PLT 1).

CITATION LIST

Patent Literature

PTL 1: JP 4886162 B (registered on Dec. 16, 2011)

SUMMARY

Technical Problem

However, in a case that the imaging hole having a large opening diameter is formed in the effective region on the display surface of the display panel, the imaging hole is formed that passes through a plurality of scanning signal lines and a plurality of data signal lines formed on a panel substrate of the display panel. Thus, there occurs a problem in that the plurality of scanning signal lines and the plurality of data signal lines are separated and disconnected.

One aspect of the disclosure is to achieve an EL device, a manufacturing method for the EL device, and a manufacturing apparatus for the EL device that are capable of forming an imaging hole in an effective region of a display panel while maintaining a plurality of scanning signal lines and a plurality of data signal lines as they are.

Solution to Problem

An EL device according to an aspect of the disclosure includes a display panel configured to display an image on a display area in a display surface, and an imaging element arranged on a side of a surface opposite to the display surface, the imaging element being configured to image a subject on a side of the display surface, wherein the display panel includes a panel substrate in which a plurality of scanning signal lines and a plurality of data signal lines intersecting with the plurality of scanning signal lines are formed, and an EL layer formed on the panel substrate, the EL layer being configured to display the image based on scanning signals from the plurality of scanning signal lines and data signals from the plurality of data signal lines, and an imaging hole formed in the display area straddles the plurality of scanning signal lines and the plurality of data signal lines in a case of being viewed from a direction perpendicular to the display surface, the imaging hole being configured to guide light form the subject to the imaging element.

Advantageous Effects of Disclosure

According to one aspect of the disclosure, the imaging hole can be formed in the effective region of the display panel while a plurality of scanning signal lines and a plurality of data signal lines are maintained as they are.

BRIEF DESCRIPTION OF DRAWINGS

FIG. 5A is a cross-sectional view of the EL device in an area where the imaging hole is not formed, and FIG. 5B is a cross-sectional view of the EL device according to a second embodiment in an area where the imaging hole, formed in the display panel of the EL device, is formed.

DESCRIPTION OF EMBODIMENTS

First Embodiment

Figure 1A:
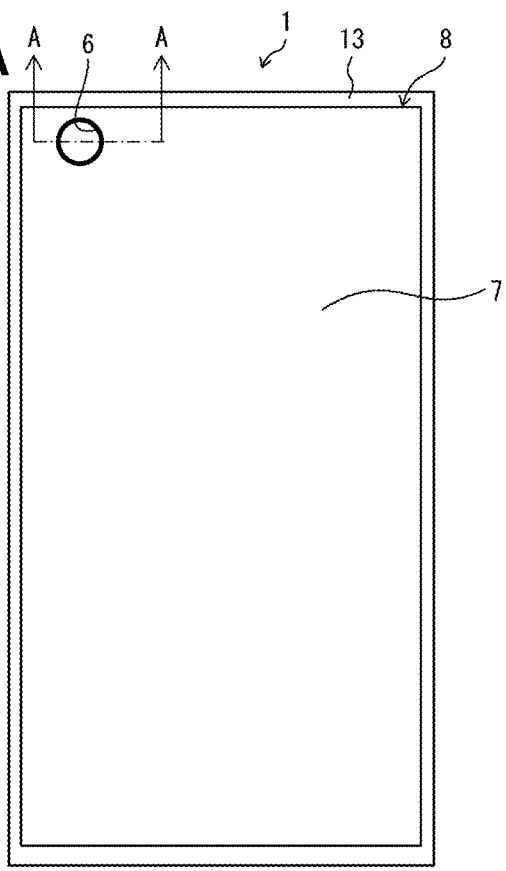
FIG. 1A is a plan view of an EL device according to a first embodiment.
Figure 1B:
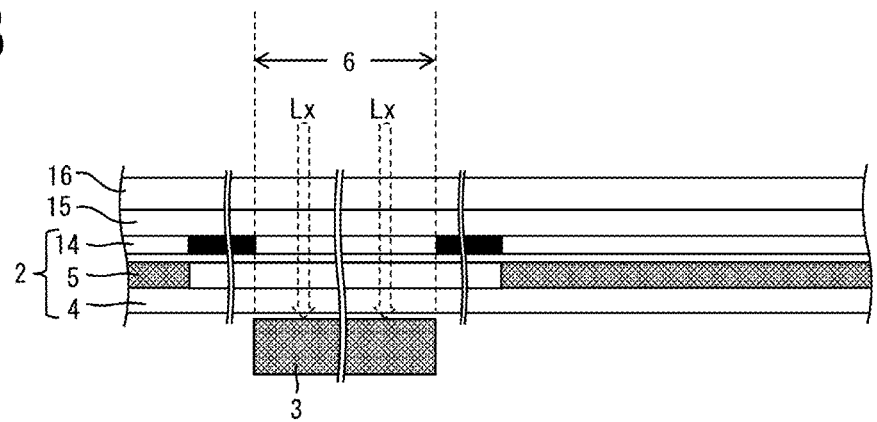
FIG. 1B is a cross-sectional view taken along line A-A' illustrated in FIG. 1A.
Figure 4A:
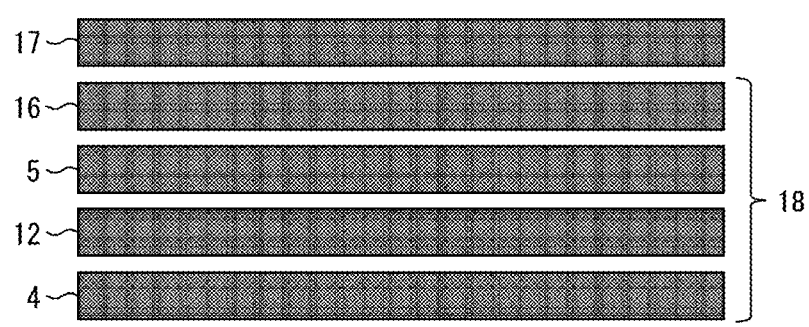
FIG. 4A is a cross-sectional view of the EL device in an area where the imaging hole is not formed.

FIG. 1A is a plan view of an EL device 1 according to a first embodiment, and FIG. 1B is a cross-sectional view taken along line A-A' illustrated in FIG. 1A. The EL device 1 includes a display panel 2. A display area 8 for displaying an image and a frame-shaped non-display area 13 surrounding the display area 8 are arranged on a display surface 7 of the display panel 2. A protection film 16 is provided on the display panel 2 via an adhesive layer 15. Then, an optical sheet 17 is provided on the protection film 16 (FIGS. 4A and B).

In the EL device 1, an imaging element 3 arranged on the side of a surface opposite to the display surface 7 is provided to image a subject, being present on the side of the display surface 7 of the display panel 2, which is not illustrated.

Figure 2A:
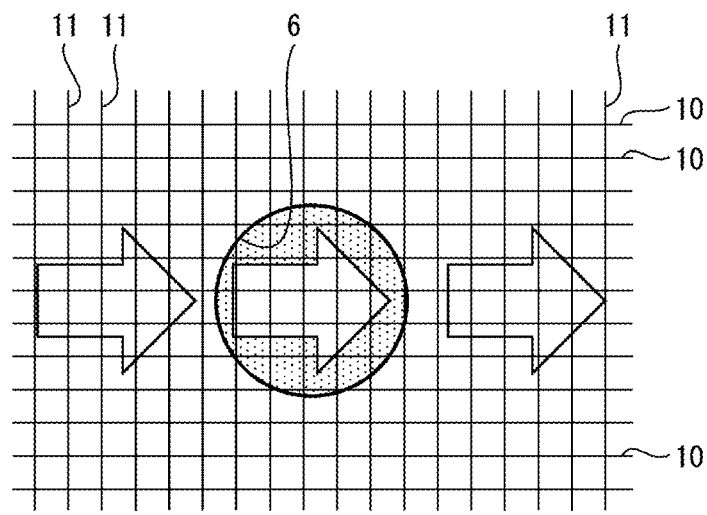
FIG. 2A is a plan view to describe a relation between an imaging hole formed in a display panel of the EL device, and scanning signal lines and data signal lines.
Figure 2B:
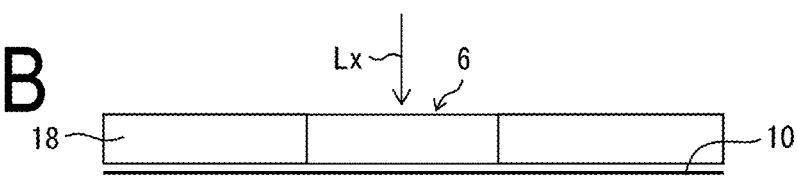
FIG. 2B is a cross-sectional view to describe the relation of FIG. 2A.
Figure 2C:
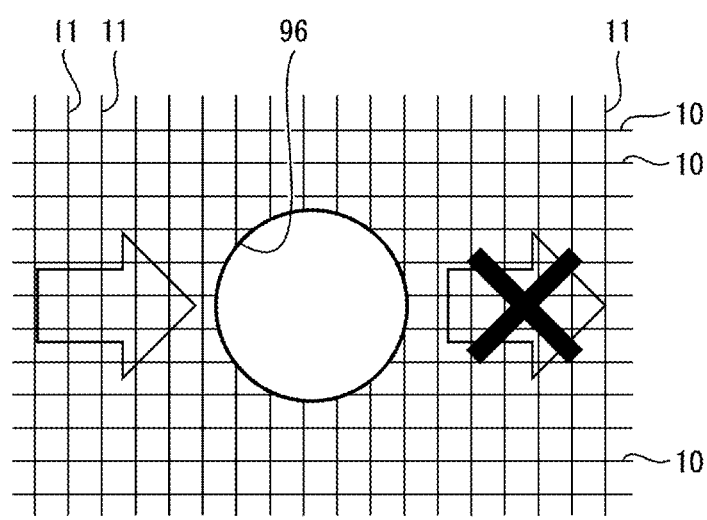
FIG. 2C is a plan view to describe a relation between the imaging hole, and the scanning signal lines and data signal lines according to a comparison example.
Figure 2D:
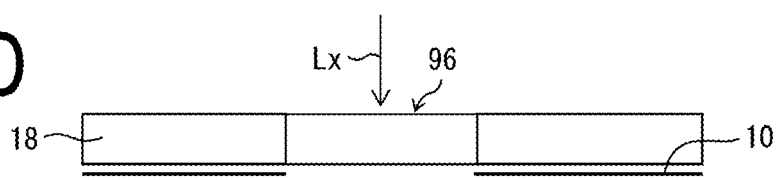
FIG. 2d is a cross-sectional view to describe the realtion of FIG. 2C.

FIG. 2A is a plan view to describe a relation between an imaging hole 6 formed in the display panel 2 of the EL device 1, and scanning signal lines 10 and data signal lines 11, and FIG. 2B is a cross-sectional view to describe the relation, and FIG. 2C is a plan view to describe a relation between an imaging hole 96, and the scanning signal lines 10 and the data signal lines 11 according to a comparison example, and FIG. 2D is a cross-sectional view to describe the relation.

The display panel 2 includes a panel substrate 4 in which a plurality of scanning signal lines 10 and a plurality of data signal lines 11 intersecting with the plurality of scanning signal lines 10 are formed, and an EL layer 5 that is formed on the panel substrate 4 for displaying an image based on scanning signals from the plurality of scanning signal lines 10 and data signals from the plurality of data signal lines 11. A sealing layer 14 is formed on the EL layer 5 in the display panel 2.

Figure 3:
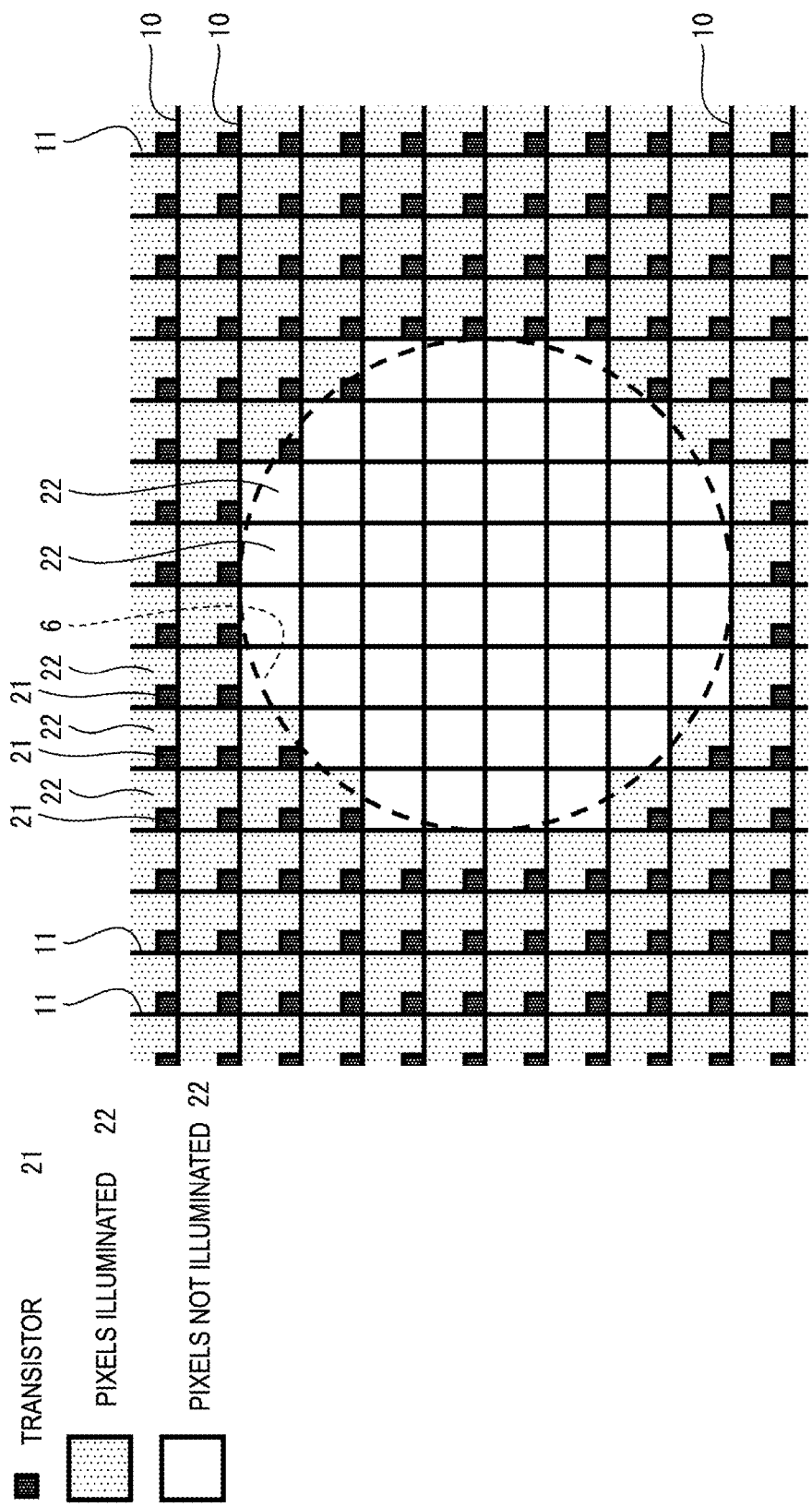
FIG. 3 is a plan view to describe a relation between the imaging hole formed in the display panel and transistors.
Figure 4B:
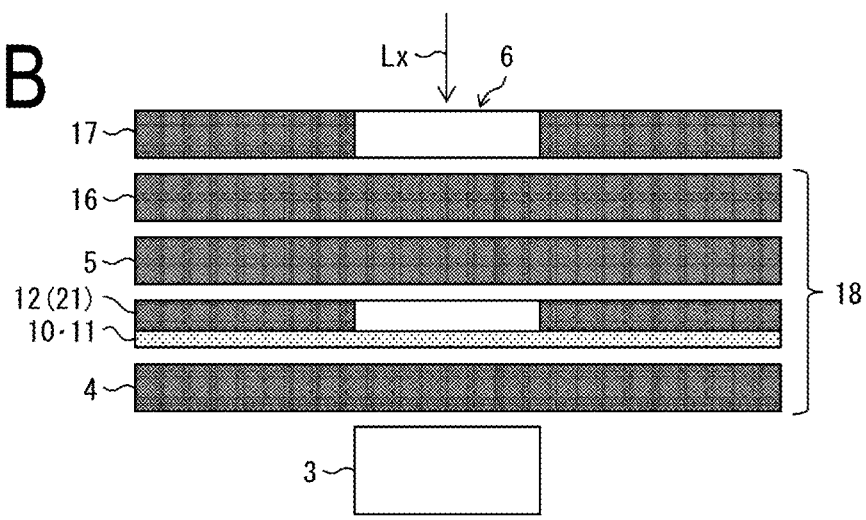
FIG. 4B is a cross-sectional view of the EL device in an area where the imaging hole is formed.

FIG. 3 is a plan view to describe a relation between the imaging hole 6 formed in the display panel 2 and transistors 21. FIG. 4A is a cross-sectional view of the EL device in an area where the imaging hole 6 is not formed, and FIG. 4B is a cross-sectional view of the EL device in an area where the imaging hole 6 is formed.

The imaging hole 6 for guiding light Lx from a subject to the imaging element 3 is formed in the display area 8, straddling the plurality of scanning signal lines 10 and the plurality of data signal lines 11 in case of being viewed from a direction perpendicular to the display surface 7 of the display panel 2.

It is preferable that the plurality of scanning signal lines 10 and the plurality of data signal lines 11 be formed of a transparent material. This is because the light Lx from the subject favorably passes through the plurality of scanning signal lines 10 and the plurality of data signal lines 11 and enters the imaging element 3.

A transistor layer 12 formed between the panel substrate 4 and the EL layer 5 includes a plurality of transistors 21 formed in a plurality of pixels 22 corresponding to respective intersection points between the plurality of scanning signal lines 10 and the plurality of data signal lines 11. As illustrated in FIGS. 3 and 4B, the transistors 21 in the transistor layer 12 are not formed in an area corresponding to the imaging hole 6, and only the plurality of scanning signal lines 10 and the plurality of data signal lines 11 are formed in the area corresponding to the imaging hole 6 between the panel substrate 4 and the EL layer 5.

Thus, the area of the pixels 22 where the transistors 21 are formed, is illuminated by the EL layer 5, but the area of the pixels 22, being inside the imaging hole 6, in which the transistors 21 are not formed, is not illuminated even in a case that the EL layer 5 is formed.

For example, as illustrated in FIG. 3, the pixel 22, of which half or more part is inside the imaging hole 6, can be configured not to include the transistor 21 as "the pixel that is not illuminated". The pixels 22, of which a part is inside the imaging hole 6 may be configured not to include the transistor 21 as "the pixel that is not illuminated". Thus, the transistors 21 in the transistor layer 12 are formed in an area excluding the imaging hole 6.

The optical sheet 17 such as a polarizing plate is formed on the protection film 16. The optical sheet 17 is formed in the area where the imaging hole 6 is not formed, and is not formed in the area corresponding to the imaging hole 6.

The protection film 16 is also formed in the area corresponding to the imaging hole 6, but preferable to have a high transparency.

The EL layer 5 is also formed in the area corresponding to the imaging hole 6.

The panel substrate 4 is also formed in the area corresponding to the imaging hole 6, but preferable to have a high transparency.

As illustrated in FIG. 2C, in a case that a simple through-hole is formed as the imaging hole 96 corresponding to the imaging element 3, the scanning signal lines 10 and the data signal lines 11 intersecting with the imaging hole 96 are separated and disconnected by the imaging hole 96. Thus, the scanning signals cannot be transmitted by the scanning signal lines 10, and the data signals cannot be transmitted by the data signal lines 11. Consequently, there occurs a problem in that a favorable image cannot be displayed in the display area 8 of the display panel 2.

In contrast, according to the present embodiment, the imaging hole 6 corresponding to the imaging element 3 is formed in the display area 8, straddling the plurality of scanning signal lines 10 and the plurality of data signal lines 11. Thus, the imaging hole 6 having a large opening diameter can be formed in the display area 8 of the display panel 2 while the plurality of scanning signal lines 10 and the plurality of data signal lines 11 are maintained as they are. Consequently, a camera can be mounted in the display area 8 of the display panel 2.

Second Embodiment

A second embodiment of the disclosure will be described below. For the convenience of explanation, members having the same functions as the members described in the foregoing embodiment will be given the same reference signs, and descriptions thereof will be omitted.

FIG. 5A is a cross-sectional view of the EL device in an area where the imaging hole 6 is not formed, and FIG. 5B is a cross-sectional view of the EL device in an area where the imaging hole 6, formed in the display panel of the EL device according to the second embodiment, is formed.

A difference from the first embodiment described above is an area where the EL layer 5 is formed. In the first embodiment, the EL layer 5 is also formed in the area corresponding to the imaging hole 6. In contrast, according to the second embodiment, as illustrated in FIG. 5B, the EL layer 5 is formed in the area where the imaging hole 6 is not formed, and is not formed in the area corresponding to the imaging hole 6.

This allows the EL layer 5 not to exist in the area corresponding to the imaging hole 6. Consequently, the light Lx passing from a subject to the imaging element 3 through the imaging hole 6 enters the imaging element 3 more favorably.

Supplement

An EL device of a first aspect includes a display panel configured to display an image on a display area in a display surface, and an imaging element arranged on a side of a surface opposite to the display surface, the imaging element being configured to image a subject on a side of the display surface, wherein the display panel includes a panel substrate in which a plurality of scanning signal lines and a plurality of data signal lines intersecting with the plurality of scanning signal lines are formed, and an EL layer formed on the panel substrate, the EL layer being configured to display the image based on scanning signals from the plurality of scanning signal lines and data signals from the plurality of data signal lines, and an imaging hole formed in the display area straddles the plurality of scanning signal lines and the plurality of data signal lines in a case of being viewed from a direction perpendicular to the display surface, the imaging hole being configured to guide light from the subject to the imaging element.

In a second aspect, the plurality of scanning signal lines and the plurality of data signal lines are formed of a transparent material, and the light from the subject passes through the scanning signal lines and the data signal lines and enters the imaging element.

In a third aspect, the panel substrate includes a transistor, and the transistor is formed in an area excluding the imaging hole of the panel substrate.

In a fourth aspect, the EL layer is formed in an area excluding the imaging hole.

In a fifth aspect, the EL layer is formed in an area including the imaging hole.

A manufacturing method for an EL device of a sixth aspect includes a display panel forming step for forming a display panel configured to display an image on a display area in a display surface, and an imaging element arranging step for arranging an imaging element on a side of a surface opposite to the display surface, the imaging element being configured to image a subject on a side of the display surface, wherein the display panel forming step includes a panel substrate manufacturing step for manufacturing a panel substrate in which a plurality of scanning signal lines and a plurality of data signal lines intersecting with the plurality of scanning signal lines are formed, an EL layer forming step for forming an EL layer on the panel substrate, the EL layer being configured to display the image based on scanning signals from the plurality of scanning signal lines and data signals from the plurality of data signal lines, and an imaging hole forming step for forming an imaging hole, in the display area, that straddles the plurality of scanning signal lines and the plurality of data signal lines in a case of being viewed from a direction perpendicular to the display surface, the imaging hole being configured to guide light from the subject to the imaging element.

A manufacturing apparatus for an EL device of a seventh aspect includes a display panel forming mechanism configured to form a display panel to display an image on a display area in a display surface, and an imaging element arranging mechanism configured to arrange an imaging element on a side of a surface opposite to the display surface to image a subject on a side of the display surface, wherein the display panel forming mechanism includes a panel substrate manufacturing mechanism configured to manufacture a panel substrate in which a plurality of scanning signal lines and a plurality of data signal lines intersected with the plurality of scanning signal lines are formed, an EL layer forming mechanism configured to form an EL layer on the panel substrate, the EL layer configured to display the image, on a basis of scanning signals from the plurality of scanning signal lines and data signals from the plurality of data signal lines, and an imaging hole forming mechanism configured to form an imaging hole to guide light from the subject to the imaging element in the display area to straddle the plurality of scanning signal lines and the plurality of data signal lines when viewed from a direction perpendicular to the display surface.

The disclosure is not limited to each of the embodiments stated above, and various modifications may be implemented within a range not departing from the scope of the claims. Embodiments obtained by appropriately combining technical approaches stated in each of the different embodiments also fall within the scope of the technology of the disclosure. Moreover, novel technical features may be formed by combining the technical approaches stated in each of the embodiments.

REFERENCE SIGNS LIST

1 EL device
2 Display panel
3 Imaging element
4 Panel substrate
5 EL layer
6 Imaging hole
7 Display surface
8 Display area
10 Scanning signal line
11 Data signal line
12 Transistor layer
21 Transistor

The invention claimed is:

1. An EL device comprising:
a display panel configured to display an image on a display area in a display surface; and
an imaging element arranged on a side of a surface opposite to the display surface, the imaging element being configured to image a subject on a side of the display surface,
wherein the display panel includes
a panel substrate in which a plurality of scanning signal lines and a plurality of data signal lines intersecting with the plurality of scanning signal lines are formed, and
an EL layer formed on the panel substrate, the EL layer being configured to display the image based on scanning signals from the plurality of scanning signal lines and data signals from the plurality of data signal lines, and
an imaging hole formed in the display area straddles the plurality of scanning signal lines and the plurality of data signal lines in a case of being viewed from a direction perpendicular to the display surface, the imaging hole being configured to guide light from the subject to the imaging element.

2. The EL device according to claim 1,
wherein the plurality of scanning signal lines and the plurality of data signal lines are formed of a transparent material, and
the light from the subject passes through the scanning signal lines and the data signal lines and enters the imaging element.

3. The EL device according to claim 1,
wherein the panel substrate includes a transistor, and
the transistor is formed in an area excluding the imaging hole of the panel substrate.

4. The EL device according to claim 1,
wherein the EL layer is formed in an area excluding the imaging hole.

5. The EL device according to claim 1,
wherein the EL layer is formed in an area including the imaging hole.

6. A manufacturing method for an EL device, comprising:
a display panel forming step for forming a display panel configured to display an image on a display area in a display surface; and
an imaging element arranging step for arranging an imaging element on a side of a surface opposite to the display surface, the imaging element being configured to image a subject on a side of the display surface,
wherein the display panel forming step includes
a panel substrate manufacturing step for manufacturing a panel substrate in which a plurality of scanning signal lines and a plurality of data signal lines intersecting with the plurality of scanning signal lines are formed,
an EL layer forming step for forming an EL layer on the panel substrate, the EL layer being configured to display the image based on scanning signals from the plurality of scanning signal lines and data signals from the plurality of data signal lines, and
an imaging hole forming step for forming an imaging hole, in the display area, that straddles the plurality of scanning signal lines and the plurality of data signal lines in a case of being viewed from a direction perpendicular to the display surface, the imaging hole being configured to guide light from the subject to the imaging element.

7. A manufacturing apparatus for an EL device, comprising:
- a display panel forming mechanism for forming a display panel configured to display an image on a display area in a display surface; and
- an imaging element arranging mechanism for arranging an imaging element on a side of a surface opposite to the display surface, the imaging element being configured to image a subject on a side of the display surface;
- wherein the display panel forming mechanism includes
- a panel substrate manufacturing mechanism for manufacturing a panel substrate in which a plurality of scanning signal lines and a plurality of data signal lines intersecting with the plurality of scanning signal lines are formed,
- an EL layer forming mechanism for forming an EL layer on the panel substrate, the EL layer being configured to display the image based on scanning signals from the plurality of scanning signal lines and data signals from the plurality of data signal lines, and
- an imaging hole forming mechanism for forming an imaging hole, in the display area, that straddles the plurality of scanning signal lines and the plurality of data signal lines in a case of being viewed from a direction perpendicular to the display surface, the imaging hole being configured to guide light from the subject to the imaging element.

* * * * *